United States Patent [19]

Westwick

[11] Patent Number: 4,647,865
[45] Date of Patent: Mar. 3, 1987

[54] PARASITIC INSENSITIVE SWITCHED CAPACITOR INPUT STRUCTURE FOR A FULLY DIFFERENTIAL OPERATIONAL AMPLIFIER

[75] Inventor: Alan L. Westwick, Austin, Tex.

[73] Assignee: Motorola, Inc., Schaumburg, Ill.

[21] Appl. No.: 831,207

[22] Filed: Feb. 20, 1986

[51] Int. Cl.[4] .............................................. H03F 1/08
[52] U.S. Cl. ..................................... 330/51; 330/107; 330/258; 333/173
[58] Field of Search ...................... 330/9, 51, 107, 109, 330/258, 294, 275, 301; 307/353, 491; 328/151; 333/173

[56] References Cited

U.S. PATENT DOCUMENTS 4,574,250  3/1986  Senderowicz ...................... 330/258

OTHER PUBLICATIONS

Senderowicz, "A Family of Differential NMOS Analog Circuits for a PCM Codec Filter Chip," *IEEE Journal of Solid-State Circuits*, vol. SC-17, No. 6, Dec. 1982, pp. 1014-1023.

Primary Examiner—James B. Mullins
Attorney, Agent, or Firm—John Fisher; Jeffrey Van Myers; Robert L. King

[57] ABSTRACT

An input structure which is parasitic insensitive and allows a fully differential amplifier to receive a single input voltage while maintaining a predetermined common-mode input voltage is provided. A single input voltage is charged onto two capacitors which are coupled in series between the input voltage and a predetermined common-mode reference voltage terminal during a first time period. During a second time period, the two capacitors are reconfigured so that each capacitor is connected between the reference voltage terminal and a predetermined one of the inputs of the fully differential amplifier. Due to the balanced nature of the input structure, all parasitic capacitance error terms are rejected by the differential amplifier.

6 Claims, 2 Drawing Figures

PARASITIC INSENSITIVE SWITCHED CAPACITOR INPUT STRUCTURE FOR A FULLY DIFFERENTIAL OPERATIONAL AMPLIFIER

TECHNICAL FIELD

This invention relates generally to amplifiers, and more particularly, to switched capacitor fully differential operational amplifiers.

BACKGROUND ART

Large valued single input signals typically present problems for fully differential operational amplifiers. When one of the inputs of a differential amplifier is grounded and a single input signal is applied to the other input, there is theoretically no problem associated with this arrangement. However, the input common-mode voltage of the differential amplifier is therefore equal to one-half of the input signal which is referenced from ground. In actuality, due to a finite common-mode input voltage range which every realizable differential amplifier has, the presence of a large input voltage can result in a common-mode input voltage which is greater than the differential amplifier can accomodate. If the common-mode input voltage is exceeded, an undesirable delay occurs before the output voltage is resolved and provided by the differential amplifier. Therefore, the settling time of a differential amplifier may increase above a tolerable value. Also, the common-mode input voltage is susceptible to much variation in this type of circuit operation.

To avoid these problems, others have adapted a fully differential amplifier by using a switched capacitor input structure to accept a single input signal and convert the signal to a differential signal. For example, a switched capacitor fully differential amplifier is shown and described in "A Family of Differential NMOS Analog Circuits for a PCM Codec Filter Chip" by Senderowicz, Dreyer, Huggins, Rahim and Laber, in the IEEE *Journal of Solid-State Circuits*, Volume SC-17, No. 6, Dec. 1982, pages 1014–1021. In general, such operational amplifiers are parasitic prone in that parasitic charge is coupled to the operational amplifier and results in an error voltage. Further, the use of some switched capacitor structures may vary the transfer characteristics of the amplifier structure which may detrimentally affect voltage gain and frequency response.

BRIEF DESCRIPTION OF THE INVENTION

Accordingly, an object of the present invention is to provide an improved parasitic insensitive switched capacitor input structure for a fully differential operational amplifier.

Another object of the present invention is to provide an improved fully differential amplifier having improved common-mode input voltage control.

Yet another object of the present invention is to provide an improved switched capacitor structure.

In carrying out the above and other objects of the present invention, there is provided, in one form, a single input parasitic insensitive input circuit for a fully differential operational amplifier having first and second inputs and outputs. A first switch has a first terminal coupled to the first input of the operational amplifier, a control terminal for receiving a first control signal, and a second terminal. A second switch has a first terminal coupled to the second input of the operational amplifier, a control terminal for receiving the first control signal, and a second terminal. A third switch has a first terminal coupled to the second terminal of the first switch, a second terminal coupled to the second terminal of the second switch, and a control terminal for receiving a second control signal. A first capacitor has a first electrode coupled to the second terminal of the first switch, and a second electrode. A second capacitor has a first electrode coupled to the second terminal of the second switch and a second electrode coupled to a reference voltage terminal. In one form, an input portion is coupled to the second electrode of the first capacitor, for selectively alternately coupling an input voltage and the reference voltage terminal to the second electrode of the first capacitor. In another form, an input portion is coupled to the first and second capacitors wherein an input signal is coupled to the first and second capacitors during a first time period. The second electrodes of the first and second capacitors are coupled to a reference voltage terminal during a second time period after the first time period.

These and other objects, features and advantages will be more clearly understood from the following detailed description taken in conjunction with the accompanying drawings.

DETAILED DESCRIPTION OF THE INVENTION

Figure 1:
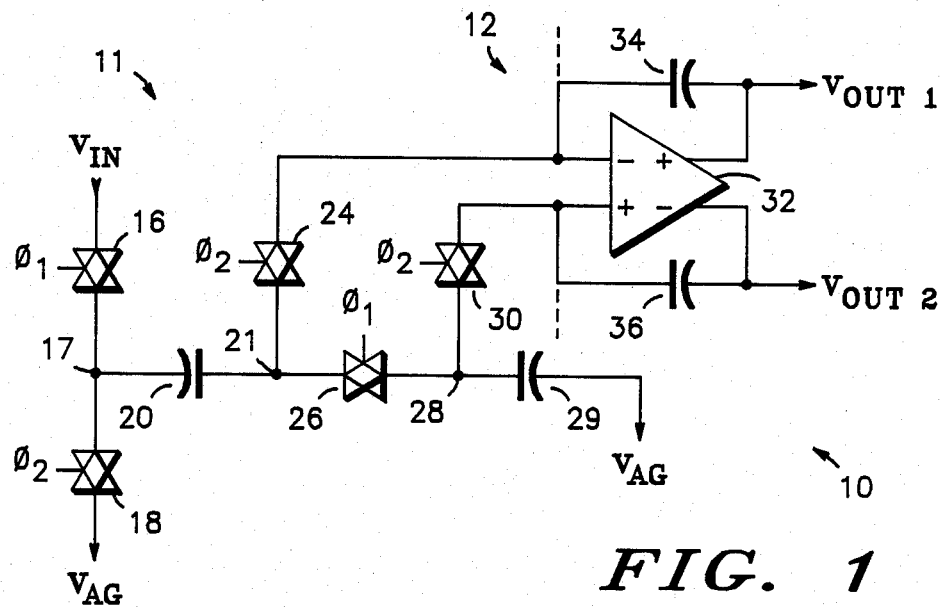
FIG. 1 illustrates in partial schematic form a switched capacitor differential amplifier in accordance with the present invention.

Shown in FIG. 1 is a fully differential operational amplifier 10 in accordance with the present invention. Operational amplifier 10 generally comprises an input portion 11 and an amplifier portion 12.

Input portion 11 comprises a switch 16 having a first terminal for receiving an input voltage, $V_{IN}$, and a second terminal connected to a node 17. A control terminal of switch 16 is connected to a control signal labeled "$\phi_1$". A switch 18 has a first terminal connected to node 17 and a second terminal connected to a reference terminal for receiving a reference voltage such as analog ground, $V_{AG}$. A control terminal of switch 18 is connected to a control signal labeled "$\phi_2$". A capacitor 20 has a first electrode connected to node 17 and a second electrode connected to a node 21. A switch 24 has a first terminal connected to node 21 and a second terminal. A control terminal of switch 24 is connected to control signal $\phi_2$. A switch 26 has a first terminal connected to node 21, a second terminal connected to a node 28 and a control terminal connected to control signal $\phi_1$. A first electrode of a capacitor 29 is connected to node 28, and a second electrode of capacitor 29 is connected to the $V_{AG}$ reference voltage terminal. A switch 30 has a first terminal connected to node 28, and a second terminal. In the illustrated form, switches 16, 18, 24, 26 and 30 are conventional MOS switches which are clocked by both a control signal and a complement of the control signal. Clock signals $\phi_1$ and $\phi_2$ are nonoverlapping clock signals.

Amplifier portion 12 comprises an operational amplifier 32 having both a positive and a negative input. Operational amplifier 32 also has positive and negative outputs. The second terminal of switch 24 is connected to both the negative input of operational amplifier 32 and a first electrode of a capacitor 34. The second electrode of capacitor 34 is connected to the positive output of operational amplifier 32 which provides a first output voltage, Vout 1. A second terminal of switch 30 is connected to both the positive input of operational amplifier 32 and a first electrode of a capacitor 36. The second electrode of capacitor 36 is connected to the negative output of operational amplifier 32 for providing a second output voltage, Vout 2.

In operation, operational amplifier 10 is a parasitic insensitive input structure which receives an input voltage $V_{IN}$ from a constant voltage driven source and provides first and second output voltages which are proportional to a differential in the input voltage and the $V_{AG}$ reference. Initially, control signal $\phi_1$ makes switches 16 and 26 conductive and control signal $\phi_2$ makes switches 18, 24 and 30 nonconductive. Therefore, the input voltage is selectively sampled and charge shared onto capacitors 20 and 29 wherein the first electrodes of capacitors 20 and 29 are each at a higher voltage potential than the second electrodes thereof. In a preferred form, capacitors 20 and 29 each have an equal value of capacitance so that the input voltage is equally charged onto capacitors 20 and 29. Therefore, a voltage of ($V_{IN}/2$) exists across each of capacitors 20 and 29. After capacitors 20 and 29 have been charged by the input voltage, control signal $\phi_1$ makes switches 16 and 26 nonconductive and control signal $\phi_2$ makes switches 18, 24 and 30 conductive. The first electrode of capacitor 20 is now coupled to reference voltage $V_{AG}$ which translates the charge on capacitor 20 so that the voltage which is coupled by switch 24 to the negative input of differential amplifier 32 is ($-V_{IN}/2$). The voltage across capacitor 29 is not translated so that the voltage which is coupled to the positive input of differential amplifier 32 is ($+V_{IN}/2$). Therefore, the input voltage has been exactly divided between the two inputs of differential amplifier 32 and a common-mode input voltage of $V_{AG}$ has been established by using analog ground as the reference voltage at the reference voltage terminal. However, the most significant aspect to input portion 11 is the fact that differential amplifier 12 has an input structure coupled thereto which is exactly symmetric and which results in a parasitic insensitive structure.

In the illustrated form, parasitics which result from device overlap capacitances associated with switches 24, 26 and 30 are effectively cancelled as a result of the fact that an equal amount of parasitic charge is coupled to each input of differential amplifier 32. Both the first electrode of capacitor 20 and the second electrode of capacitor 29 are always connected to low impedance voltage driven nodes. The second electrode of capacitor 29 is always connected to $V_{AG}$ which is zero volts. Therefore, the parasitic capacitance associated with the $V_{AG}$ reference voltage node does not charge and contribute an error. Similarly, the first electrode of capacitor 20 is connected to either $V_{AG}$ or to a voltage driven input. The voltage source which supplies the input signal holds the first electrode of capacitor 20 at the input voltage regardless of what parasitics may be coupled to node 17. Therefore, capacitors 20 and 29 charge to the full value of $V_{IN}$ and the parasitic capacitance associated with node 17 does not function to charge share the input voltage with capacitors 20 and 29 which would otherwise result in an error. It should be noted that the fact that input structure 11 is totally insensitive to the parasitics of capacitors 20 and 29 provides an effective parasitic insensitive structure. Further, because input structure 11 appears fully symmetrical from the inputs of differential amplifier 32, power supply rejection problems associated with unbalanced structures do not exist. For example, noise sources from each of switches 24 and 30 are substantially equal and are balanced.

In the illustrated form, the common-mode input voltage of differential amplifier 32 is determined by the value of the voltage which is coupled to the second terminal of switch 18 and to the second electrode of capacitor 29. Typically, the common-mode input voltage is desired to be zero volts. It should also be noted that the present invention is a sampled voltage system which may be implemented by using other types of switches and is not limited to MOS transistor switches commonly referred to as "transmission gates". Further, any type of fully differential amplifier may be used in conjunction with the present invention. In the described form, other circuitry may also be coupled to either or both the positive and negative inputs of differential amplifier 32 as is illustrated by the dashed lines in FIG. 1. For example, in switched capacitor filter applications, feedback terms may be coupled to the inputs of differential amplifier 32. Also, additional input voltage terms may be coupled to either or both inputs of differential amplifier 32 by using an input structure analogous to input portion 11.

Figure 2:
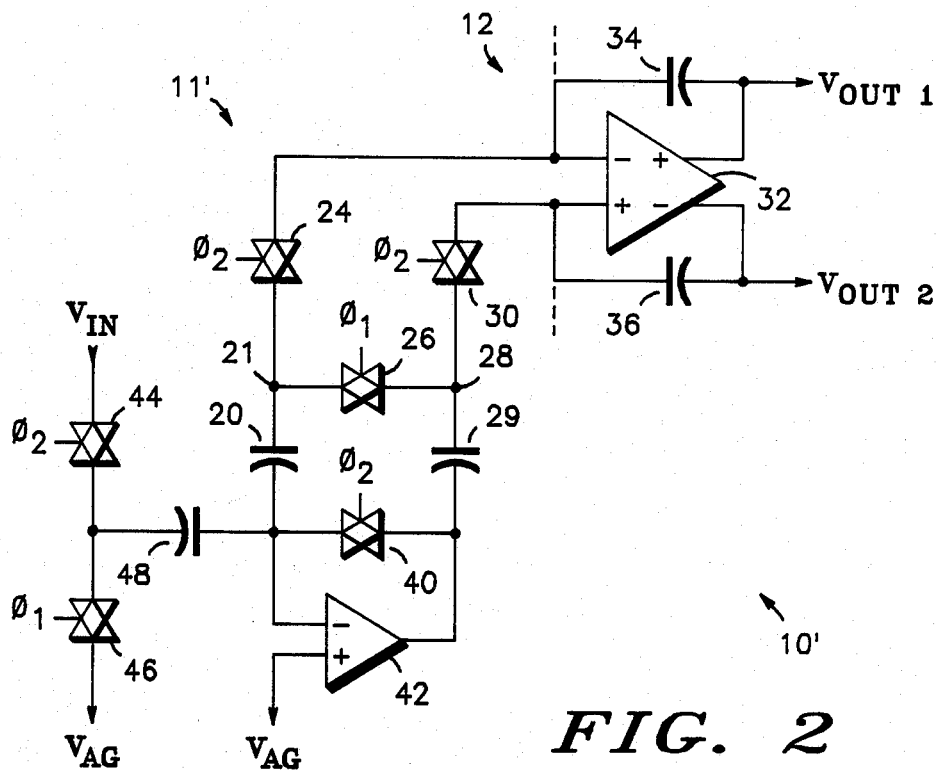
FIG. 2 illustrates in partial schematic form another embodiment of the present invention.

Shown in FIG. 2 is a fully differential operational amplifier 10' which is another implementation of the present invention wherein a voltage source is not available to supply the input signal at the input terminal. In the illustrated form, the input signal is presented as a charge from a current source or from any other origin. Circuit elements common to FIG. 1 have remained the same number in FIG. 2. Differential amplifier portion 12 is the same circuit as in FIG. 1. However, input portion 11' differs somewhat from input portion 11 of FIG. 1. In particular, the first electrode of capacitor 20 is connected to a first terminal of a switch 40 and to a negative input of a buffer circuit 42. The second electrode of capacitor 29 is connected to a second terminal of switch 40 and to an output of buffer circuit 42. A positive input of buffer circuit 42 is connected to a reference voltage terminal for receiving a reference voltage such as $V_{AG}$. An input voltage $V_{IN}$ is connected to a first terminal of a switch 44, and control signal $\phi_2$ is connected to a control terminal of switch 44. A second terminal of switch 44 is connected to both a first terminal of a switch 46 and a first electrode of a capacitor 48. A second terminal of switch 46 is connected to reference voltage $V_{AG}$ at the reference voltage terminal, and control signal $\phi_1$ is connected to a control terminal of switch 46. A second electrode of capacitor 48 is connected to the negative input of buffer circuit 42. It should be noted that any type of input signal source structure which is not a constant voltage source may be used with the embodiment of FIG. 2, and the use of switches 44 and 46 and capacitor 48 as an input signal source are for purposes of example only.

In operation, assume again that control signals $\phi_1$ and $\phi_2$ are nonoverlapping clock signals. Initially, control signal $\phi_2$ functions to make switches 44 and 40 conductive as well as making switches 24 and 30 conductive. Control signal $\phi_1$ makes switches 46 and 26 nonconductive. Therefore, an input voltage $V_{IN}$ charged onto capacitor 48. Simultaneously, buffer circuit 42 is in a unity gain configuration and is autozeroed by switch 40 so that any voltage differential existing between the output and negative input of buffer circuit 42 is nulled. Some amount of an offset voltage referenced to analog ground exists at the negative input of buffer circuit 42. Therefore, capacitor 48 is charged to the input voltage referenced to the offset voltage of buffer circuit 42. After capacitor 48 is charged to the input voltage referenced to the offset voltage, control signal $\phi_2$ makes switches 44 and 40 nonconductive and control signal $\phi_1$ makes switches 46 and 26 conductive. By connecting the first electrode of capacitor 48 to analog ground, capacitor 48 is discharged and the charge on capacitor 48 is level translated and equally charge shared onto capacitors 20 and 29 with respect to the offset voltage of buffer circuit 42. Therefore, if capacitors 20 and 29 are again chosen to be equal valued, capacitors 20 and 29 each charge to ($V_{IN}/2$). When switches 24, 30 and 40 become conductive, the second electrodes of capacitors 20 and 29 are connected together by switch 40 and maintained at the offset voltage relative to analog ground by buffer circuit 42. The offset voltage term from buffer circuit 42 charged onto each of capacitors 20 and 29 is coupled to fully differential amplifier 32 as a small common-mode signal which is rejected by fully differential amplifier 32. The operation of differential amplifier 10' is otherwise the same as described above. Therefore, an input structure which utilizes a stored sampled input voltage rather than an input voltage source has been provided and is also parasitic insensitive.

By now it should be apparent that a parasitic insensitive input structure for a fully differential operational amplifier when driven by a single input voltage has been provided. The fully differential operational amplifier does not experience a large common-mode input voltage which can result in a poor operational amplifier settling time. The common-mode input voltage can be accurately set at any predetermined reference voltage. However, the typical common-mode input voltage is zero volts or analog ground as described.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A single input parasitic insensitive input circuit for a fully differential operational amplifier having first and second inputs and outputs, comprising:
   first switching means having a first terminal connected to the first input of the operational amplifier, a control terminal for receiving a first control signal, and a second terminal;
   second switching means having a first terminal connected to the second input of the operational amplifier, a control terminal for receiving the first control signal, and a second terminal;
   third switching means having a first terminal connected to the second terminal of the first switching means, a second terminal connected to the second terminal of the second switching means, and a control terminal for receiving a second control signal;
   first capacitance means having a first electrode connected to the second terminal of the first switching means, and a second electrode;
   second capacitance means having a first electrode connected to the second terminal of the second switching means, and a second electrode connected to a reference voltage terminal; and
   input means coupled to the second electrode of the first capacitance means, for selectively alternately coupling an input voltage and the reference voltage terminal to the second electrode of the first capacitance means, said input voltage being charged shared onto the first and second capacitance means concurrently.

2. The single input parasitic insensitive input circuit of claim 1 wherein said input means further comprise:
   fourth switching means having a first terminal for receiving the input voltage, a second terminal coupled to the second electrode of the first capacitance means, and a control terminal for receiving the second control signal; and
   fifth switching means having a first terminal coupled to the second electrode of the first capacitance means, a second terminal coupled to the reference voltage terminal, and a control terminal for receiving the first control signal.

3. The single input parasitic insensitive input circuit of claim 2 wherein said first and second control signals are nonoverlapping clock signals.

4. A single input parasitic insensitive input circuit for a fully differential operational amplifier having first and second inputs and outputs, comprising:
   first switching means having a first terminal connected to the first input of the operational amplifier, a control terminal for receiving a first control signal, and a second terminal;
   second switching means having a first terminal connected to the second input of the operational amplifier, a control terminal for receiving the first control signal, and a second terminal;
   third switching means having a first terminal connected to the second terminal of the first switching means, a second terminal connected to the second terminal of the second switching means, and a control terminal for receiving a second control signal;
   first capacitance means having a first electrode connected to the second terminal of the first switching means, and a second electrode;
   second capacitance means having a first electrode connected to the second terminal of the second switching means, and a second electrode connected to a reference voltage terminal; and
   input means coupled to the second electrodes of the first and second capacitance means, for coupling an input signal onto the first and second capacitance means concurrently during a first time period and coupling the second electrode of the first capacitance means to a reference voltage terminal during a second time period after the first time period;
   said first control signal making the third switching means conductive during the first time period and said second control signal making the first and second switching means conductive during the second time period.

5. A single input parasitic insensitive input circuit for a fully differential operational amplifier having first and second inputs and outputs, comprising:

first switching means having a first terminal coupled to the first input of the operational amplifier, a control terminal for receiving a first control signal, and a second terminal;

second switching means having a first terminal coupled to the second input of the operational amplifier, a control terminal for receiving the first control signal, and a second terminal;

third switching means having a first terminal coupled to the second terminal of the first switching means, a second terminal coupled to the second terminal of the second switching means, and a control terminal for receiving a second control signal;

first capacitance means having a first electrode coupled to the second terminal of the first switching means, and a second electrode;

second capacitance means having a first electrode coupled to the second terminal of the second switching means, and a second electrode coupled to a first reference voltage terminal;

buffer means having a first input coupled to a second reference voltage terminal, a second input for providing the first reference voltage terminal, and an output coupled to the second electrode of the first capacitance means;

fourth switching means having a first terminal coupled to the output of the buffer means, a second terminal coupled to the second input of the buffer means, and a control terminal for receiving the first control signal;

fifth switching means having a first terminal for receiving an input voltage, a second terminal, and a control terminal for receiving the first control signal;

sixth switching means having a first terminal coupled to the second terminal of the fifth switching means, a second terminal coupled to the second reference voltage terminal, and a control terminal for receiving the second control signal; and third capacitance means having a first electrode coupled to the second terminal of the fifth switching means, and a second electrode coupled to the second input of the buffer means.

6. The single input parasitic insensitive input circuit of claim 5 wherein said first and second control signals are nonoverlapping clock signals.

* * * * *